United States Patent
Sanduleanu et al.

(10) Patent No.: US 7,872,503 B2
(45) Date of Patent: Jan. 18, 2011

(54) COMBINATORIAL LOGIC CIRCUIT

(75) Inventors: Mihai Adrian Tiberiu Sanduleanu, Eindhoven (NL); Eduard Stikvoort, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 0 days.

(21) Appl. No.: 11/572,915

(22) PCT Filed: Jul. 18, 2005

(86) PCT No.: PCT/IB2005/052384

§ 371 (c)(1),
(2), (4) Date: Aug. 15, 2007

(87) PCT Pub. No.: WO2006/013492

PCT Pub. Date: Feb. 9, 2006

(65) Prior Publication Data

US 2007/0285119 A1    Dec. 13, 2007

(30) Foreign Application Priority Data

Jul. 29, 2004  (EP) ................................. 04103647

(51) Int. Cl.
H03K 19/20    (2006.01)
H03K 19/094   (2006.01)
(52) U.S. Cl. ................ 326/115; 326/112; 326/119; 326/120; 326/121; 326/122
(58) Field of Classification Search .............. 326/38, 326/85, 104, 112, 115, 119–122
See application file for complete search history.

(56) References Cited

U.S. PATENT DOCUMENTS 6,424,194 B1 * 7/2002 Hairapetian ................. 327/210
6,700,413 B1 * 3/2004 Chou ......................... 326/127

(Continued)

FOREIGN PATENT DOCUMENTS

DE    4030631 A1    4/1992

(Continued)

OTHER PUBLICATIONS

International Search Report dated Nov. 23, 2005 in connection with PCT Application No. PCT/IB2005/052384.

(Continued)

*Primary Examiner*—James H. Cho
*Assistant Examiner*—Matthew C Tabler

(57) ABSTRACT

It is disclosed a combinatorial logic circuit comprising a first logic block (B1) coupled to a supply terminal ($V_{DD}$) via a first resistor means (RI) and via a second resistor means (R2) for receiving respective first and second supply currents (111, 112). The circuit further comprises a second logic block (B2) coupled to the supply terminal ($V_{DD}$) via the first resistor means (R1) and via the second resistor means (R2) for receiving respective third and fourth supply currents (122, 121). A first output terminal (Q−) coupled to the first block (B1) and to the first resistor means (R1). A second output terminal (Q+) coupled to the second logic block (B2) and to the second resistor means (R2). A first current source (I0) coupled to at least one of the first output terminal (Q−) and/or second output terminal (Q+) for providing a first supply current (I1) through the first resistor means (R1), which is substantially equal to a second supply current (I2) through the second resistor means (R2).

20 Claims, 5 Drawing Sheets

U.S. PATENT DOCUMENTS

Figure 1:
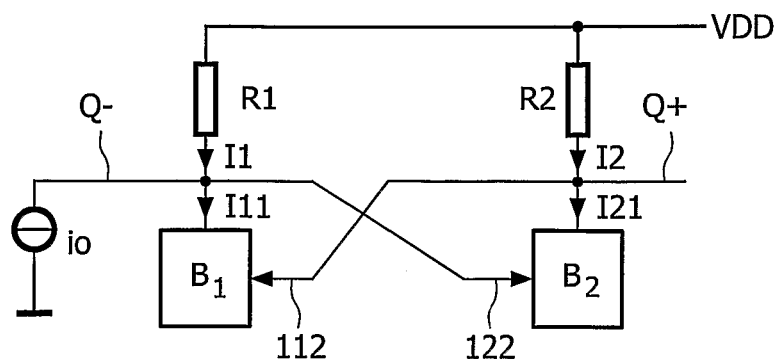

| | | | |
|---|---|---|---|
| 6,972,597 B2 * | 12/2005 | Kim | 326/86 |
| 6,977,526 B2 * | 12/2005 | Li | 326/83 |
| 7,098,697 B2 * | 8/2006 | Kucharski et al. | 326/126 |
| 7,126,382 B2 * | 10/2006 | Keil | 326/110 |
| 7,250,790 B2 * | 7/2007 | Guiraud | 326/126 |
| 7,425,844 B1 * | 9/2008 | Chung et al. | 326/68 |
| 7,474,126 B2 * | 1/2009 | Payne | 326/126 |
| 2002/0084806 A1 * | 7/2002 | Yang | 326/127 |
| 2003/0214327 A1 * | 11/2003 | Huang et al. | 326/121 |
| 2004/0051563 A1 * | 3/2004 | Zhang | 326/115 |
| 2004/0085089 A1 * | 5/2004 | Yin | 326/54 |
| 2004/0100307 A1 * | 5/2004 | Wong et al. | 326/115 |
| 2004/0183569 A1 * | 9/2004 | Choe | 326/95 |

FOREIGN PATENT DOCUMENTS

WO    WO 2005/076478 A1    8/2005

OTHER PUBLICATIONS

Written Opinion of the International Searching Authority dated Jan. 29, 2007 in connection with PCT Application No. PCT/IB2005/052384.

* cited by examiner

COMBINATORIAL LOGIC CIRCUIT

The invention relates to a combinatorial logic circuit.

Logic circuits are used on a very large scale in various applications. The overall trend in the development of logic circuits is increasing their switching speed and lowering their supply voltage for maintaining reasonable power dissipation within the chips. Furthermore, the use of differential-in differential-out circuits has increased for obtaining a maximum output swing for the signals.

Following the above-mentioned trend, current-controlled CMOS circuits have been introduced. U.S. Pat. No. 6,424, 194 discloses a family of logic circuits using current-controlled CMOS logic fabricated in conventional CMOS process technology. There are implemented various logic circuits as inverters/buffers, level shifters, NAND, NOR, XOR gates etc. It is observed that when the circuits are provided with more than one input differential signal, there are three levels of transistors between a positive supply terminal VDD and ground e.g. a current source level, a first input level and a second input level when a two-input circuit is considered. Because of the stacking, the supply voltage cannot be lowered below $V_{GS}+2(V_{GS}-V_T)+\Delta V$ where $V_{GS}$ is the gate-source voltage of one of the CMOS transistors $V_T$ is the threshold voltage of the process and $\Delta V$ is the voltage drop on the resistors R coupled between the stacked transistors and the positive supply terminal. Dummy transistors are provided at one output of the gates for matching the loading conditions at both outputs. It is observed that due to process variation the common-mode voltage levels in the drains of the output transistors differ, which results in additional noise and limits the maximum output swing.

It is therefore an object of the present invention to provide a combinatorial logic circuit providing a large output swing. This object is achieved in a device comprising:

- a first logic block coupled to a supply terminal via a first resistor means and via a second resistor means for receiving respective first and second supply currents,
- a second logic block coupled to the supply terminal via the first resistor means and via the second resistor means for receiving respective third and fourth supply currents,
- a first output terminal coupled to the first block and to the first resistor means,
- a second output terminal coupled to the second logic block and to the second resistor means, and
- a current source coupled to at least one of the first output terminal and/or second output terminal for providing a first supply current through the first resistor means, which is substantially equal to a second supply current through the second resistor means.

It is observed that a DC level at the first output terminal is $V_{DD}-R1*I1$ and a DC level at the second output terminal is $V_{DD}-R2*I2$. It is desirable to have the DC level at the first output equal to the DC level at the second output for obtaining a relatively large common mode rejection ratio. The current source determines the same DC level at the outputs and therefore increases a common mode rejection ratio of the circuit. As a direct consequence, the output noise is reduced and the output swing is increased.

In an embodiment of the invention the circuit first logic block and the second logic block are substantially identical. When substantially identical circuits are used, the time allocated to the design process is shortened. Furthermore, the first and the second resistor means are preferably resistors of equal resistance. In an embodiment, each block comprises a first transistor coupled in parallel to a second transistor, each transistor receiving a respective first single ended logical signal and second single ended logical signal, said transistors being further coupled to a current source and to a third transistor, which is controlled by a DC signal, the DC signal being substantially equal with an average voltage level between a logical HIGH voltage level and a logical LOW voltage level of the respective first and second single ended signals. Having two substantially identical blocks simplifies the design and implementation of the circuit. Ideally, the output signals are centered to half of the supply voltage of the circuit and the output signals are symmetric to that value. Because of the technological processes involved in obtaining the circuit, the centerline is no longer the ideal one and the output swing is reduced. For obtaining a maximum swing at the output of the circuit it is applied a DC signal acting as a threshold voltage for the circuit, the DC signal being substantially dependent on the levels of the input signals. In this application it is considered that two transistors are coupled in parallel if they have their respective drains or collectors coupled each other and their respective sources or emitters coupled each other.

In another embodiment of the invention, each logic block receives a combination of first and second components of differential signals, the first and the second component being substantially in antiphase to each other. This embodiment is particularly suitable when differential input signals are used. A further advantage is that we may still use the block structure adapted for single ended signals for differential signals.

In another embodiment of the invention each logic block comprises a first circuit coupled to a second circuit, each circuit comprising a first transistor coupled in parallel to a second transistor, said transistors being further coupled to a third transistor, said transistors being controlled by some of the first and second components of the differential signals. In a particular implementation the circuit implements a differential XOR logic function, which is particularly suitable to be used in high-speed communication networks in data and clock recovery blocks, respectively.

The embodiments refer to implementations in MOS technology but using n type channel but the inventive concept may be applied mutatis-mutandis to other technologies as e.g. GaAs, SiGe, etc. and/or using other types of transistors as p channel type transistors, PNP or NPN transistors, etc. As a consequence the terminals gate, source, drain correspond to base, emitter and collector, respectively.

Figure 2:
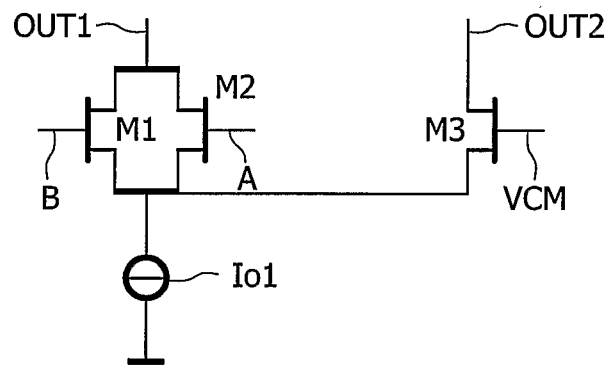
Figure 3:
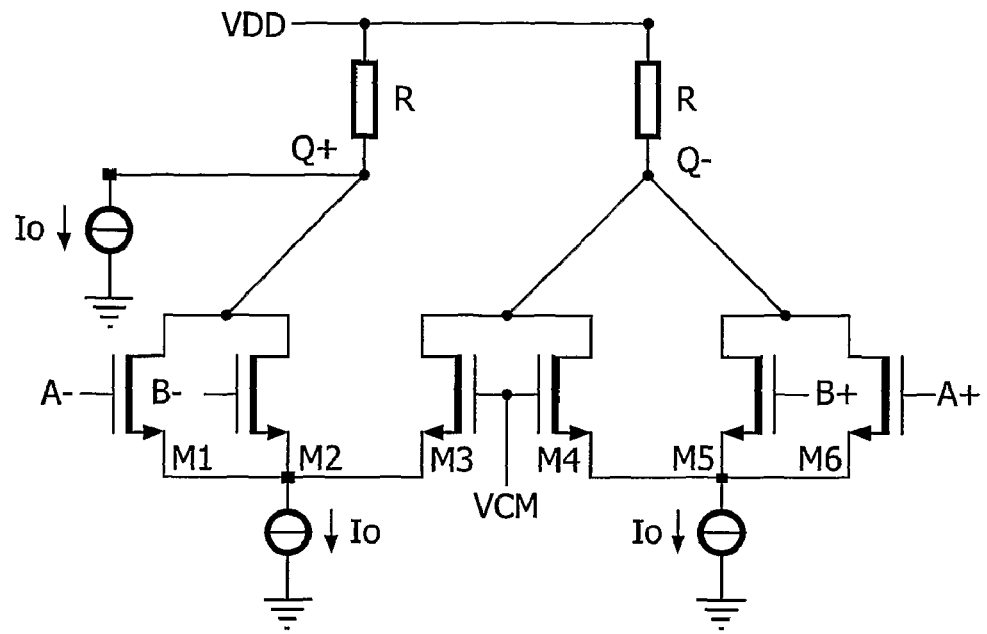
Figure 4:
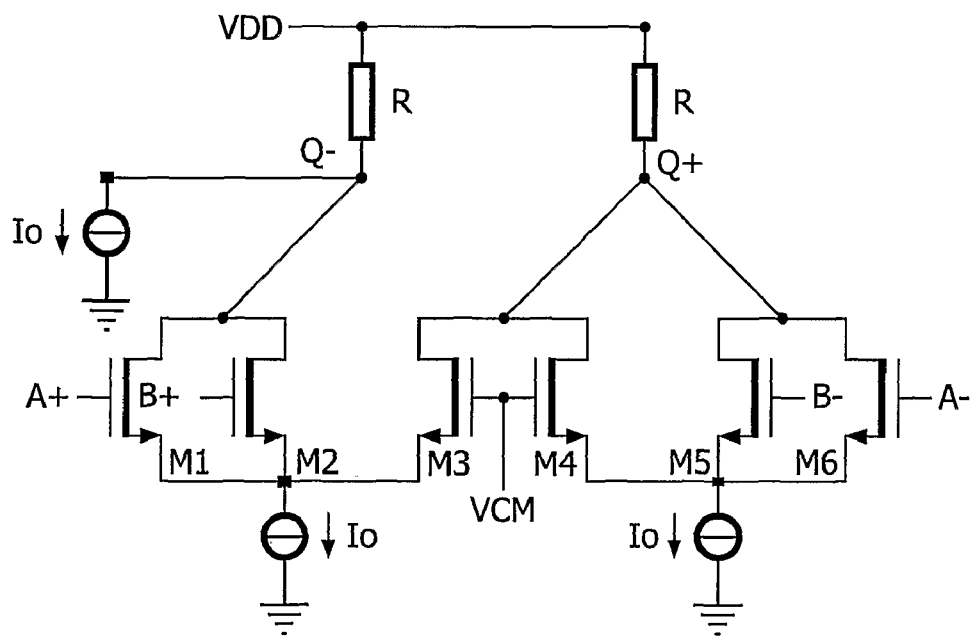
Figure 5:
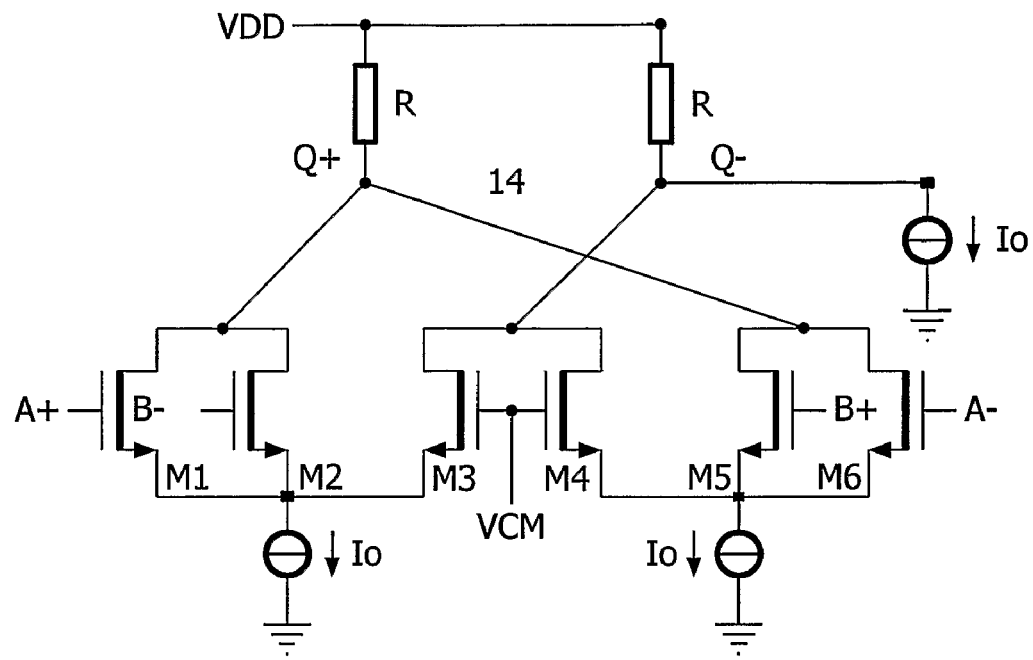

The above and other features and advantages of the invention will be apparent from the following description of exemplary embodiments of the invention with reference to the accompanying drawings, in which:

FIG. 1 depicts a block diagram of a combinatorial logic circuit, according to the invention, FIG. 2 depicts a particular implementation of a logic block, according to the invention, FIG. 3 depicts an embodiment of a differential output AND circuit, according to the invention, FIG. 4 depicts an embodiment of a differential output OR circuit, according to the invention, FIG. 5 depicts an embodiment of a differential output XOR circuit, according to the invention.

Figure 9:
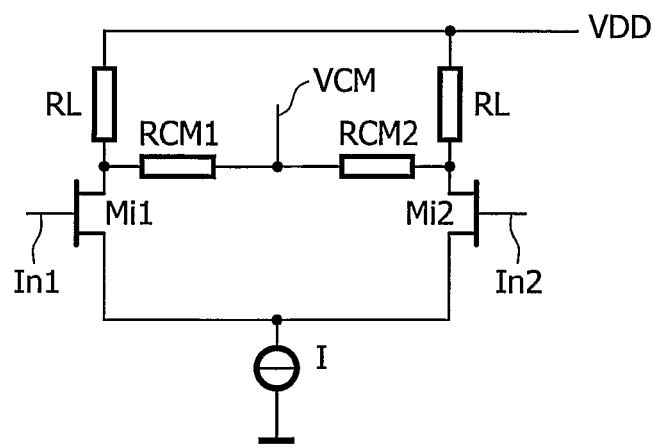
Figure 6:
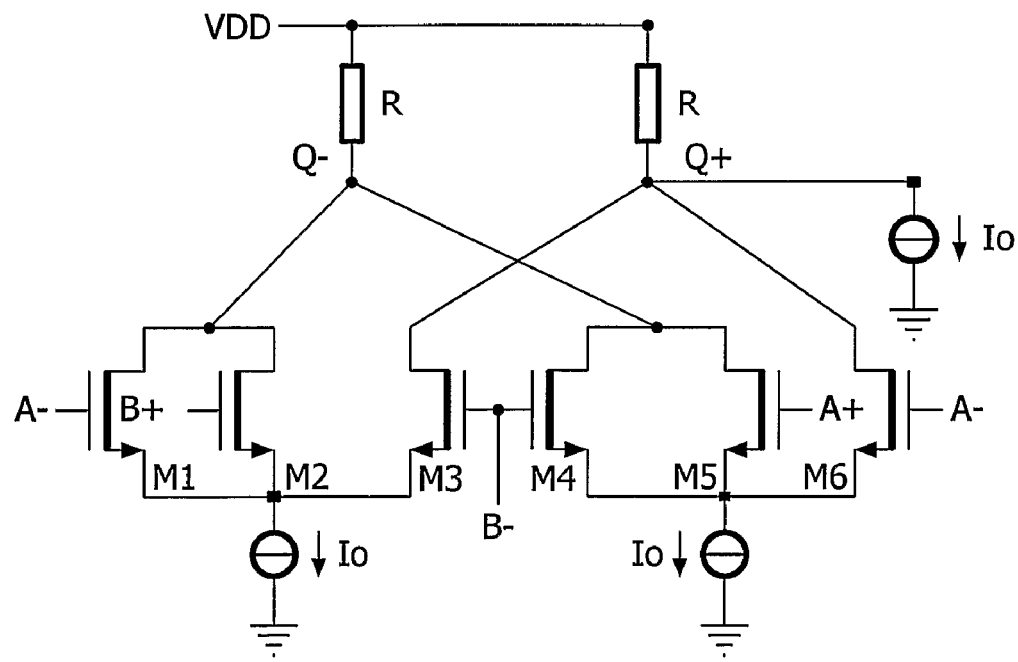
Figure 7:
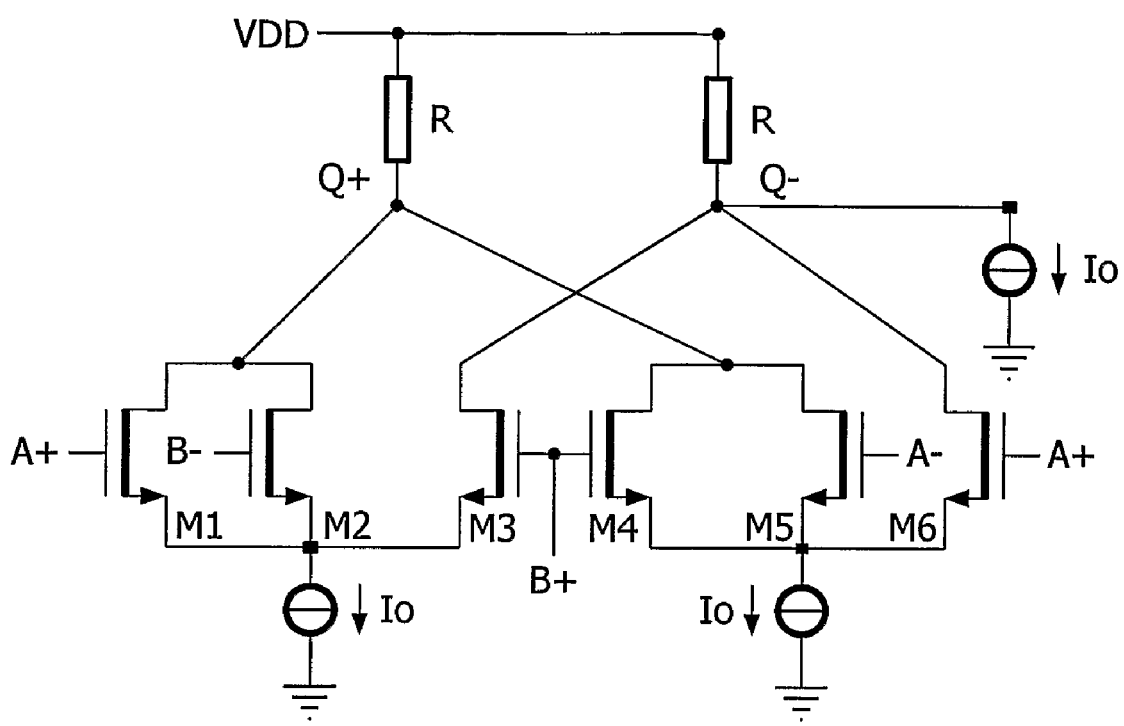
Figure 8:
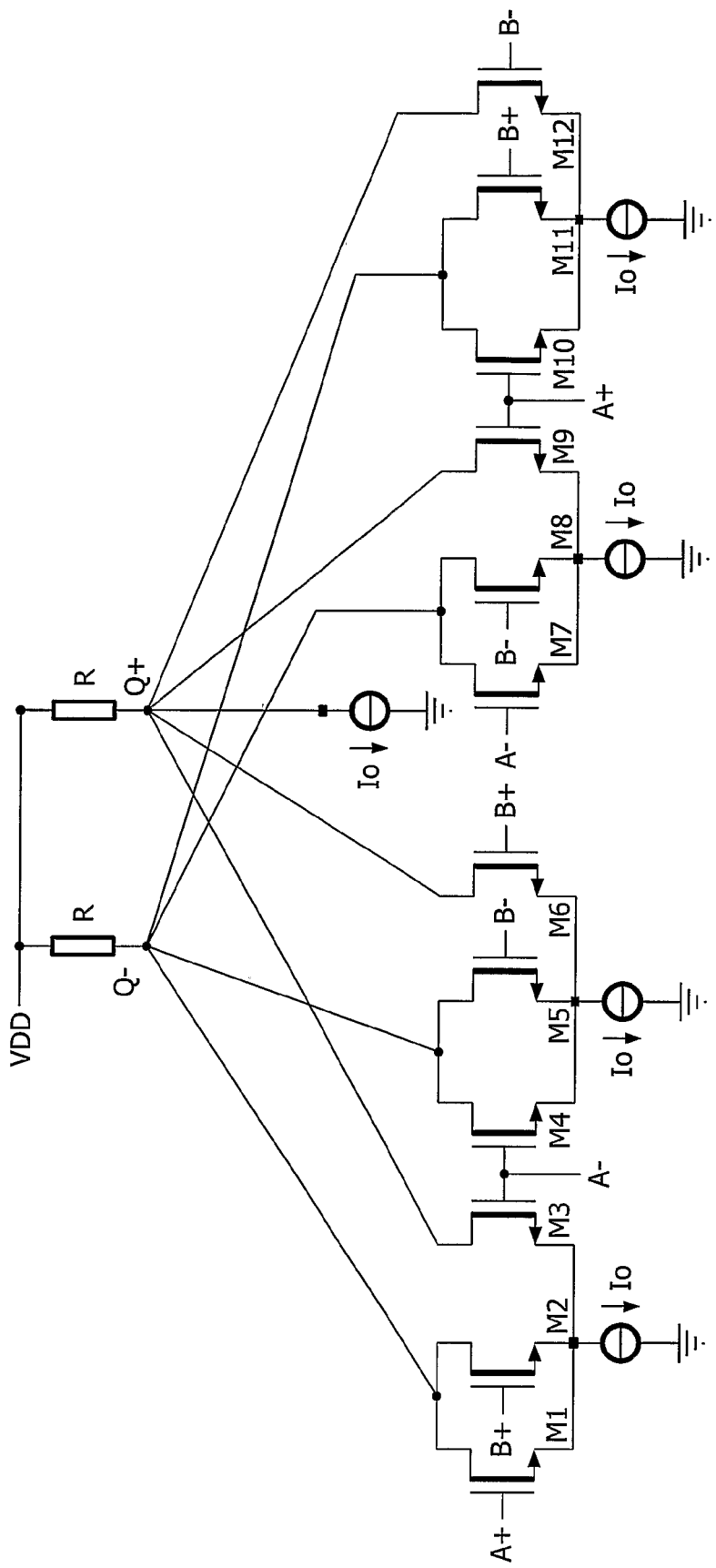

FIG. 6 depicts an embodiment of a differential-in differential-out AND circuit, according to the invention, FIG. 7 depicts an embodiment of a differential-in differential-out OR circuit, according to the invention, FIG. 8 depicts an embodiment of a differential-in differential-out XOR circuit, according to the invention, and FIG. 9 depicts a circuit providing a DC signal for controlling the logic blocks, according to the invention.

FIG. 1 depicts a block diagram of a combinatorial logic circuit, according to the invention. The circuit comprises a first logic block B1 coupled to a supply terminal $V_{DD}$ via a first resistor R1 and via a second resistor R2 for receiving respective first and second supply currents I11, I12. The circuit further comprises a second logic block B2 coupled to the supply terminal $V_{DD}$ via the first resistor R1 and via the second resistor R2 for receiving respective third and fourth supplies currents I22, I21.

A first output terminal Q− is coupled to the first block B1 and to the first resistor R1. A second output terminal Q+ is coupled to the second logic block B2 and to the second resistor R2. A first current source I0 is coupled to the first output terminal Q− for providing a first supply current I1 through the first resistor R1, which is substantially equal to a second supply current I2 through the second resistor R2. It is observed that a DC level at the first output terminal is $V_{DD}$−R1*I1 and a DC level at the second output terminal is $V_{DD}$−R2*I2. For obtaining a relatively large common mode rejection ratio it is desirable to have the DC level at the first output equal to the DC level at the second output. The current source determines the same DC level at the outputs and therefore increases the common mode rejection ratio of the circuit. As a direct consequence, the output noise is reduced and the output swing is increased. Preferable, the circuit first logic block B1 and the second logic block B2 are substantially identical. When substantially identical circuits are used, the time allocated to the design process is shortened.

FIG. 2 depicts a particular implementation of a logic block, according to the invention. Each block comprises a first transistor M1 coupled in parallel to a second transistor M2 i.e. respective drains terminals are connected each other and respective sources terminals are connected each other. Each transistor receives a respective first single ended logical signal A and second single ended logical signal B. A single ended signal is the opposite of a differential signal. The transistors are further coupled to a third transistor M3, which is controlled by a DC signal $V_{CM}$. The DC signal $V_{CM}$ is substantially equal to an average voltage level between a logical HIGH voltage level and a logical LOW voltage level and could be generated in a circuit as shown in FIG. 9.

FIG. 9 depicts a circuit providing a DC signal for controlling the logic blocks, according to the invention. The circuit comprises a differential pair of transistors Mi1, Mi2, each transistor comprising a source, a drain and a gate, when MOS transistors are used. The transistors are substantially identical each other and their drain are coupled to a supply terminal $V_{DD}$ via respective substantially identical resistors RL. Ideally, a DC potential in the drains of the transistors are equal and therefore, no DC current flows through a series coupling of two substantially equal common-mode resistors $R_{CM1}$, $R_{CM2}$. On the gates of the transistor is applied a differential signal In+ and In−. In commutation, when a drain of a transistor is in a HIGH state i.e. providing a HIGH voltage, the drain of the other transistor is in LOW state i.e. providing a LOW voltage. As a consequence, the voltage VCM has an average voltage level between the HIGH voltage and the LOW voltage. Practically, the common-mode resistors have a substantially larger resistance value than the value of the resistance of the resistors RL coupled to the drains of the transistors.

Returning to FIG. 2, the first transistor M1 and the second transistor M2 acts as switches for a current source I0 coupled to their sources. In use, the circuit of FIG. 2 should be to coupled to voltage, which is supplied by a supply source $V_{DD}$ and drain terminals OUT1 and OUT2 of the transistors should be coupled thereto via resistors. Different combinatorial logic functions may be implemented using two identical building blocks as shown in Table 1. In Table 1 A+ refers to a logical signal as such and A− refers to a inverted logical signal. Practical implementations of the circuits of Table 1 are shown in FIGS. 3, 4 and 5.

TABLE 1

| B1 | | | | B2 | | | | |
|---|---|---|---|---|---|---|---|---|
| A | B | OUT1 | OUT2 | A | B | OUT1 | OUT2 | Logic Function |
| A− | B− | Q+ | Q− | A+ | B+ | Q− | Q− | AND |
| A+ | B+ | Q− | Q+ | A− | B− | Q+ | Q+ | OR |
| A+ | B− | Q+ | Q− | A− | B+ | Q+ | Q− | XOR |

It is observed that the voltage corresponding to a HIGH logical level is $V_{DD}$−R*I0 and the voltage corresponding to a LOW logical level is $V_{DD}$−2*R*I0. Hence, the output voltage swing is determined by the product R*I0. A larger swing gives lower common-mode voltages at the output. This contradicts with the low supply voltage requirements. A differential logic swing of about 400 mVpp . . . 600 mVpp should be sufficient for high-speed applications as e.g. high speed serial communications.

TABLE 2

| B1 | | | | B2 | | | | $V_{CM}$ | | Logic |
|---|---|---|---|---|---|---|---|---|---|---|
| A | B | OUT1 | OUT2 | A | B | OUT1 | OUT2 | $V_{CM1}$ | $V_{CM2}$ | Function |
| A− | B+ | Q− | Q+ | B− | A+ | Q− | Q+ | B− | A− | AND |
| A+ | B− | Q+ | Q− | B+ | A− | Q+ | Q− | B+ | A+ | OR |

In Table 2, $V_{CM1}$ refers to the controlling voltage of the block B1 and $V_{CM2}$ refers to the controlling voltage of the block B2. Practical implementations of the functions are shown in FIGS. 6 and 7.

FIG. 8 depicts an embodiment of a differential-in differential-out XOR circuit, according to the invention. It is observed that the circuit comprises four blocks shown in FIG. 2. A first logic block comprises transistors M1-M6 with their respective current sources I0 and a second logic block comprises transistors M7-M12 with their respective current sources I0. Let us observe that circuits comprising transistors Mi, Mi+1, Mi+2 with i=1, 4, 7, 10 coupled to their respective current source are identical with the circuits described in FIG. 2.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed processor. The invention resides in each new feature or combination of features.

The invention claimed is:

1. A combinatorial logic circuit comprising:
a first logic block coupled to a supply terminal via a first resistor means and via a second resistor means for receiving respective first and second currents;
a second logic block coupled to the supply terminal via at least one of the first resistor means and the second resistor means for receiving at least one of respective third and fourth currents;
a first output terminal coupled to the first block and to the first resistor means;
a second output terminal coupled to the second logic block and to the second resistor means; and
a first current source coupled to at least one of the first output terminal and/or second output terminal for providing a first supply current through the first resistor means which is substantially equal to a second supply current through the second resistor means,
wherein each logic block comprises a first transistor coupled in parallel to a second transistor and a third transistor, each of the first, second and third transistors including first, second and control terminals, the first and second transistors being connected such that the first terminals of the first and second transistors are directly connected to each other and the second terminals of the first and second transistors are also directly connected to each other, the control terminals of the first and second transistors being used to receive logical signals, and the third transistor being controlled by a bias voltage applied to the control terminal of the third transistor.

2. A circuit as claimed in claim 1, wherein the first logic block and the second logic block are substantially identical.

3. A circuit as claimed in claim 1, wherein the first resistor means and the second resistor means are resistors having substantially equal resistances.

4. A circuit as claimed in claim 2, wherein the second terminal of the third transistor is connected to the second terminals of the first and second transistors, the bias voltage comprising a DC signal applied to the control terminal of the third transistor, the DC signal being substantially equal to an average voltage level between a logical HIGH voltage level and a logical LOW voltage level.

5. A circuit as claimed in claim 4, wherein said first, second and third transistors are supplied via a second current source providing a current which is substantially equal with a current supplied by the first current source.

6. A circuit as claimed in claim 1, wherein each logic block receives a combination of first and second components of differential signals, the first and second components being substantially in opposite phase to each other.

7. A circuit as claimed in claim 1, wherein each logic block comprises a first circuit coupled to a second circuit, each circuit comprising the first transistor coupled in parallel to the second transistor, each logic block further comprising a third transistor connected to the first and second transistors, the first, second and third transistors being controlled by logical signals.

8. A combinatorial logic circuit comprising:
a first logic block coupled to a supply terminal via a first resistor means and via a second resistor means for receiving respective first and second currents;
a second logic block coupled to the supply terminal via at least one of the first resistor means and the second resistor means for receiving at least one of respective third and fourth currents;
a first output terminal coupled to the first block and to the first resistor means;
a second output terminal coupled to the second logic block and to the second resistor means;
a first current source coupled to one of the first output terminal and second output terminal, the first current source configured to provide a first supply current through the first resistor means which is substantially equal to a second supply current through the second resistor means; and
a second current source coupled to at least one of the first logic block and the second logic block;
wherein each logic block comprises a first transistor coupled in parallel to a second transistor and a third transistor, each of the first, second and third transistors including first, second and control terminals, the first and second transistors being connected such that the first terminals of the first and second transistors are directly connected to each other and the second terminals of the first and second transistors are also directly connected to each other and the second current source, the control terminals of the first and second transistors being used to receive logical signals, and the third transistor being controlled by a bias voltage applied to the control terminal of the third transistor.

9. The circuit as claimed in claim 8, wherein the first logic block and the second logic block are substantially identical.

10. A circuit as claimed in claim 9, wherein each logic block further comprises a third transistor including first, second and control terminal, the second terminal of the third transistor being connected to the second terminals of the first and second transistors, the third transistor being controlled by a DC signal applied to the control terminal of the third transistor, the DC signal being substantially equal to an average voltage level between a logical HIGH voltage level and a logical LOW voltage level.

11. The circuit as claimed in claim 10, wherein said first, second and third transistors are supplied via the second current source providing a current which is substantially equal with a current supplied by the first current source.

12. The circuit as claimed in claim 8, wherein the first resistor means and the second resistor means are resistors having substantially equal resistances.

13. The circuit as claimed in claim 8, wherein each logic block receives a combination of first and second components of differential signals, the first and second components being substantially in opposite phase to each other.

14. A circuit as claimed in claim 8, wherein each logic block comprises a first circuit coupled to a second circuit, each circuit comprising the first transistor coupled in parallel to the second transistor, each logic block further comprising a third transistor connected to the first and second transistors, the first, second and third transistors being controlled by logical signals.

15. A combinatorial logic circuit comprising:
a first logic block coupled to a supply terminal via a first resistor means and via a second resistor means for receiving respective first and second currents;
a second logic block coupled to the supply terminal via at least one of the first resistor means and the second resistor means for receiving at least one of respective third and fourth currents;
a first output terminal coupled to the first block and to the first resistor means;
a second output terminal coupled to the second logic block and to the second resistor means; and
a first current source coupled to one of the first output terminal and second output terminal for providing a first supply current through the first resistor means which is substantially equal to a second supply current through the second resistor means, wherein each logic block comprises at least three transistors, each of the at least three transistors including first, second and control terminals, wherein a first transistor is coupled in parallel to a second transistor, each of the at least three transistors coupled such that the first terminals of the first and second transistors are directly connected to each other and the second terminals of the first, second and third transistors are also directly connected to each other, the first terminal of the third transistor coupled to at least one of the first and the second resistor means, the control terminals of the first and second transistors being used to receive logical signals, and the third transistor being controlled by a bias voltage applied to the control terminal of the third transistor.

16. The circuit as claimed in claim 15, wherein the first logic block and the second logic block are substantially identical.

17. The circuit as claimed in claim 15, wherein the first resistor means and the second resistor means are resistors having substantially equal resistances.

18. The circuit as claimed in claim 17, wherein said first, second and third transistors are supplied via a second current source providing a current which is substantially equal with a current supplied by the first current source.

19. The circuit as claimed in claim 15, wherein each logic block receives a combination of first and second components of differential signals, the first and second components being substantially in opposite phase to each other.

20. The circuit as claimed in claim 15, wherein each logic block comprises a first circuit coupled to a second circuit, each circuit comprising the first transistor coupled in parallel to the second transistor, each logic block further comprising a third transistor connected to the first and second transistors, the first, second and third transistors being controlled by logical signals.

\* \* \* \* \*